United States Patent
Paxton et al.

(10) Patent No.: US 7,781,149 B2
(45) Date of Patent: Aug. 24, 2010

(54) REDUCED PITCH MULTIPLE EXPOSURE PROCESS

(75) Inventors: Theodore Allen Paxton, Chandler, AZ (US); Steven George Hansen, Phoenix, AZ (US); Cassandra May Owen, Chandler, AZ (US); Todd J. Davis, Gilbert, AZ (US); Todd David Hiar, Gilbert, AZ (US); James J Hunter, Tempe, AZ (US)

(73) Assignee: ASML Netherlands B.V., Veldhoven (NL)

( * ) Notice: Subject to any disclaimer, the term of this patent is extended or adjusted under 35 U.S.C. 154(b) by 157 days.

(21) Appl. No.: 11/387,047

(22) Filed: Mar. 23, 2006

(65) Prior Publication Data

US 2006/0216653 A1  Sep. 28, 2006

Related U.S. Application Data

(63) Continuation-in-part of application No. 11/177,490, filed on Jul. 11, 2005, which is a continuation-in-part of application No. 11/086,664, filed on Mar. 23, 2005.

(51) Int. Cl.
*G03F 7/26* (2006.01)
(52) U.S. Cl. ..................................... 430/311
(58) Field of Classification Search ................. 430/311, 430/394
See application file for complete search history.

(56) References Cited

U.S. PATENT DOCUMENTS

| 5,902,716 A * | 5/1999 | Owa et al. ................. 430/312 |
| 2002/0195419 A1* | 12/2002 | Pavelchek .................... 216/16 |
| 2003/0008245 A1* | 1/2003 | Iwasaki et al. .............. 430/321 |
| 2004/0005507 A1* | 1/2004 | Lakkapragada et al. ....... 430/30 |
| 2005/0175937 A1* | 8/2005 | Bae ............................ 430/312 |
| 2005/0214674 A1* | 9/2005 | Sui et al. ................. 430/270.1 |

FOREIGN PATENT DOCUMENTS

| JP | 61-174718 A | 8/1986 |
| JP | 02-262319 A | 10/1990 |
| JP | 04-071222 A | 3/1992 |
| JP | 08-250395 A | 9/1996 |
| JP | 11-072925 A | 3/1999 |
| JP | 2002-367877 A | 12/2002 |

OTHER PUBLICATIONS

Notice of Reasons for Rejection for Japanese Patent Application No. 2006-114997 dated Jun. 1, 2009.

* cited by examiner

*Primary Examiner*—Kathleen Duda
*Assistant Examiner*—Brittany Raymond
(74) *Attorney, Agent, or Firm*—Pillsbury Winthrop Shaw Pittman LLP

(57) ABSTRACT

A lithographic method to enhance image resolution in a lithographic cluster using multiple projections and a lithographic cluster used to project multiple patterns to form images that are combined to form an image having enhanced resolution.

33 Claims, 10 Drawing Sheets

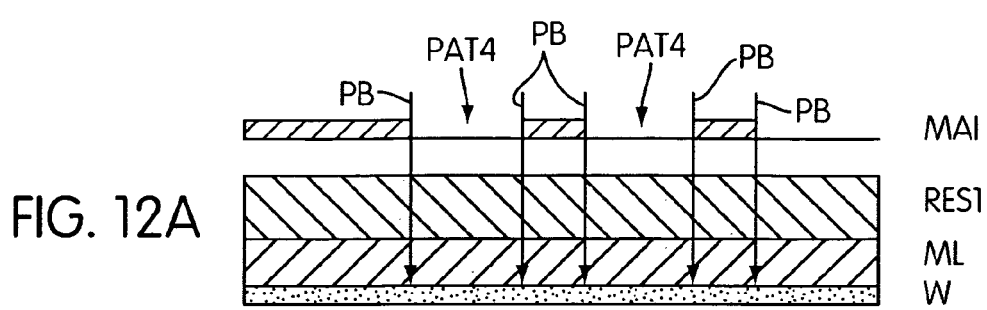
FIG. 12A
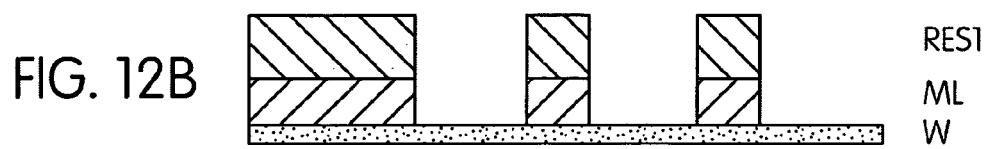
FIG. 12B
FIG. 12C
FIG. 12D
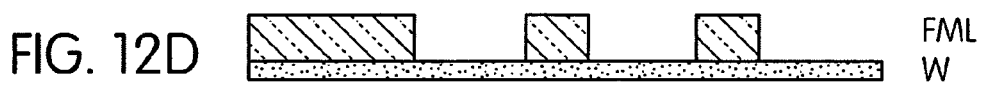
FIG. 12E
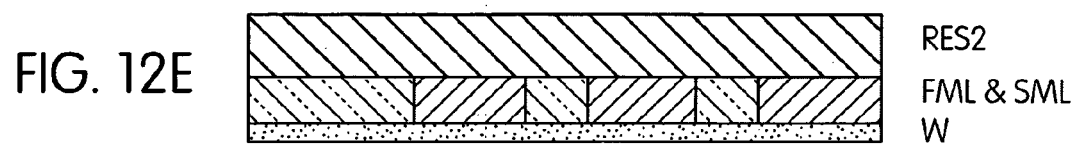
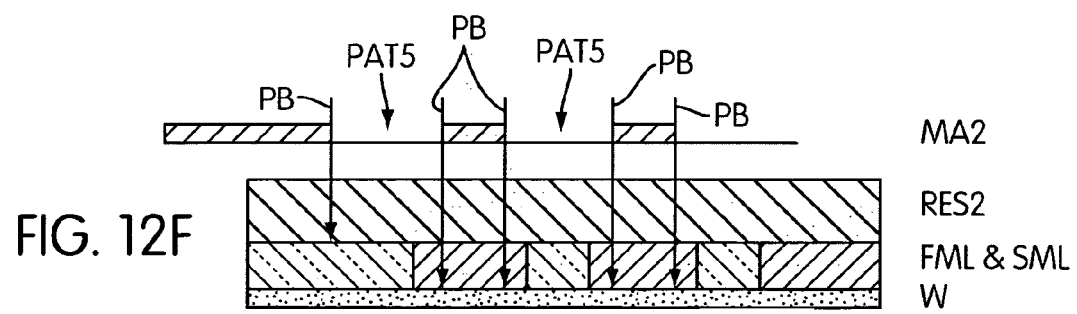
FIG. 12F
FIG. 12G
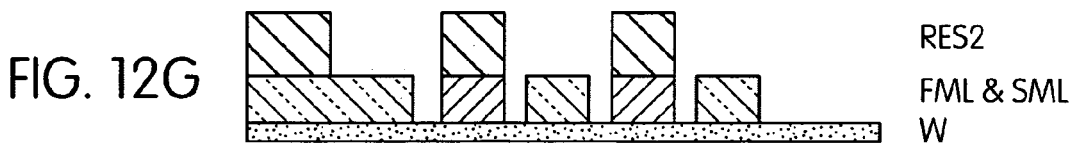
FIG. 12H
FIG. 12I

REDUCED PITCH MULTIPLE EXPOSURE PROCESS

CROSS-REFERENCE TO RELATED APPLICATIONS

This application is a continuation-in-part patent application of co-pending U.S. patent application Ser. No. 11/177,490, filed on Jul. 11, 2005, which was a continuation-in-part patent application of U.S. patent application Ser. No. 11/086,664, filed on Mar. 23, 2005, the contents of each application hereby incorporated in their entirety by reference.

BACKGROUND

1. Field

The present invention relates to a lithographic cluster and a method of making a device and enhancing image resolution in a lithographic cluster.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Development of new apparatus and methods in lithography have led to improvements in resolution of the imaged features, such as lines and contact holes or vias, patterned on a substrate, possibly leading to a resolution of less than 50 nm. This may be accomplished, for example, using a projection system having a relatively high numerical aperture (NA) greater than 0.75 NA, a wavelength of 193 nm or less, and a plethora of techniques such as use of phase shift mask, non-conventional illumination and advanced photoresist processes.

However, certain small features such as contact holes are especially difficult to fabricate. The success of manufacturing processes at sub-wavelength resolutions will rely on the ability to print a low modulation image of a projected reticle pattern or the ability to increase the image modulation of a projected reticle pattern to a level that will give acceptable lithographic yield.

Typically, the industry has used the Rayleigh criterion to evaluate the critical dimension (CD) and depth of focus (DOF) capability of a process. The CD and DOF measures can be given by the following equations:

$$CD = k_1(\lambda/NA),$$

and $$DOF = k_2(\lambda/NA^2),$$

where $\lambda$ is the wavelength of the illumination radiation, $k_1$ and $k_2$ are constants for a specific lithographic process, and NA is the numerical aperture.

Additional measures that provide insight into the difficulties associated with lithography at the resolution limit include the Exposure Latitude (EL), the Dense:Isolated Bias (DIB) (also known as iso-dense bias), and the Mask Error Enhancement Factor (MEEF). The exposure latitude describes the percentage dose range where the printed pattern's critical dimension (CD) is within acceptable limits. For example, the exposure latitude may be defined as the change in exposure dose that causes a 10% change in printed line width. Exposure Latitude is a measure of reliability in printing features in lithography. It is used along with the DOF to determine the process window, i.e., the regions of focus and exposure that keep the final resist profile (i.e., features of a desired pattern in resist) within prescribed specifications. Dense:Isolated Bias (also known as iso-dense bias) is a measure of the size difference between similar features, depending on the pattern density or the pitch at which features in resist are arranged. Finally, the MEEF describes how patterning device CD errors are transmitted into substrate CD errors.

Among the trends in lithography is to reduce the CD by lowering the wavelength used, increasing the numerical aperture, and/or reducing the value of k1. However, increasing the numerical aperture would also lead to a decrease in the DOF which ultimately could lead to limitations in process latitude. This can also be understood by combining the above two equations to obtain:

$$DOF = (k_2/k_1^2)(CD^2/\lambda).$$

From this equation it can be seen that a decrease in CD, i.e., an increase in resolution, would lead to a decrease in DOF which is unwanted in most lithographic processes and specifically in the process of printing contact holes.

In a simplified approximation of coherent illumination, the resolution of a lithography system is also conventionally quoted in terms of the smallest half-pitch of a grating that is resolvable as a function of wavelength and numerical aperture NA. For conventional optical lithography, the ultimate resolution limit is reached at $k_1=0.5$. Imaging with properties similar to a two-beam interference system allows to extend the ultimate resolution limit to the $k_1=0.25$ level.

SUMMARY

According to an aspect of the present invention, there is provided a method for enhancing image resolution in a lithographic cluster. The method includes coating a surface of a substrate with a developable material layer, coating a first resist layer on top of the developable material layer and projecting a first pattern onto an area of the substrate coated with the developable material layer and the first resist layer. The method further includes coating a second resist layer on top of the developable material layer, and projecting a second pattern onto an area of the substrate coated with the developable material layer and the second resist layer. Projecting the first pattern and projecting the second pattern produces a desired patterned image on the developable material layer.

According to another aspect of the invention, there is provided a device manufacturing method for providing a desired pattern of features on a surface of a substrate. The method includes coating the surface of the substrate with a developable material layer, coating a first resist layer on top of the developable material layer, exposing the first resist layer to an image of a first pattern, developing the first resist layer and the developable material layer to provide the developable material layer with a first target pattern, removing the first resist layer, coating a second resist layer on top of the developable material layer, exposing the second resist layer to an image of a second pattern, and developing the second resist layer and the developable material layer to provide the developable material layer with a second target pattern, wherein the first and second target patterns produce the desired pattern in the developable material layer.

According to a further aspect of the invention, there is provided a device manufacturing method for providing a desired pattern of features on a surface of a substrate. The method includes coating the surface of the substrate with a developable material layer, coating a first resist layer on top of the developable material layer, exposing the first resist layer to an image of a first pattern, developing the first resist layer and the developable material layer to provide the developable material layer with a first target pattern, removing the first resist layer, fixing the developable material layer provided with the first target pattern, supplying a supplementary developable material layer to fill voids of the first target pattern of the developable material layer, coating a second resist layer on top of the supplementary developable material layer, exposing the second resist layer to an image of a second pattern, and developing the second resist layer and the supplementary developable material layer to provide the supplementary developable material layer with a second target pattern, wherein the first and second target patterns produce the desired pattern on the surface of the substrate.

According to a further aspect of the invention, there is provided a device manufacturing method for providing a target pattern of features on a surface of a substrate comprising coating the surface of the substrate with a developable material layer, coating a resist layer on top of the developable material layer, exposing the resist layer to an image of a pattern, and developing the resist layer and the developable material layer to provide the developable material layer with the target pattern, wherein a desired pattern of features on the surface of the substrate includes the target pattern and a supplementary target pattern of features on the surface of the substrate.

According to yet another aspect of the present invention, there is provided a method for manufacturing a device. The method includes projecting a first pattern onto an area of a substrate coated with a developable material layer and a first resist layer and projecting a second pattern onto an area of the substrate coated with the developable material layer and a second resist layer, wherein projecting the first pattern and projecting the second pattern produces a desired patterned image on the developable material layer.

According to yet another aspect of the present invention, there is provided a lithographic cluster including a coating station configured to apply a developable material layer onto a substrate and to apply a first and a second resist layer on top of the developable material layer and a projection apparatus configured to project a first pattern of a first patterning device onto the substrate and to project a second pattern of a second patterning device onto the substrate. The first pattern and the second pattern are combined to produce a desired patterned image on the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a target pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may be referred to below, collectively or singularly, as a "lens."

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

These and other aspects of the invention will become more apparent and more readily appreciated from the following detailed description of the present exemplary embodiments of the invention, taken in conjunction with the accompanying drawings, of which:

FIGS. 12A-I depict the state of the substrate after performing various steps of the process shown in FIG. 11.

DETAILED DESCRIPTION

Figure 1:
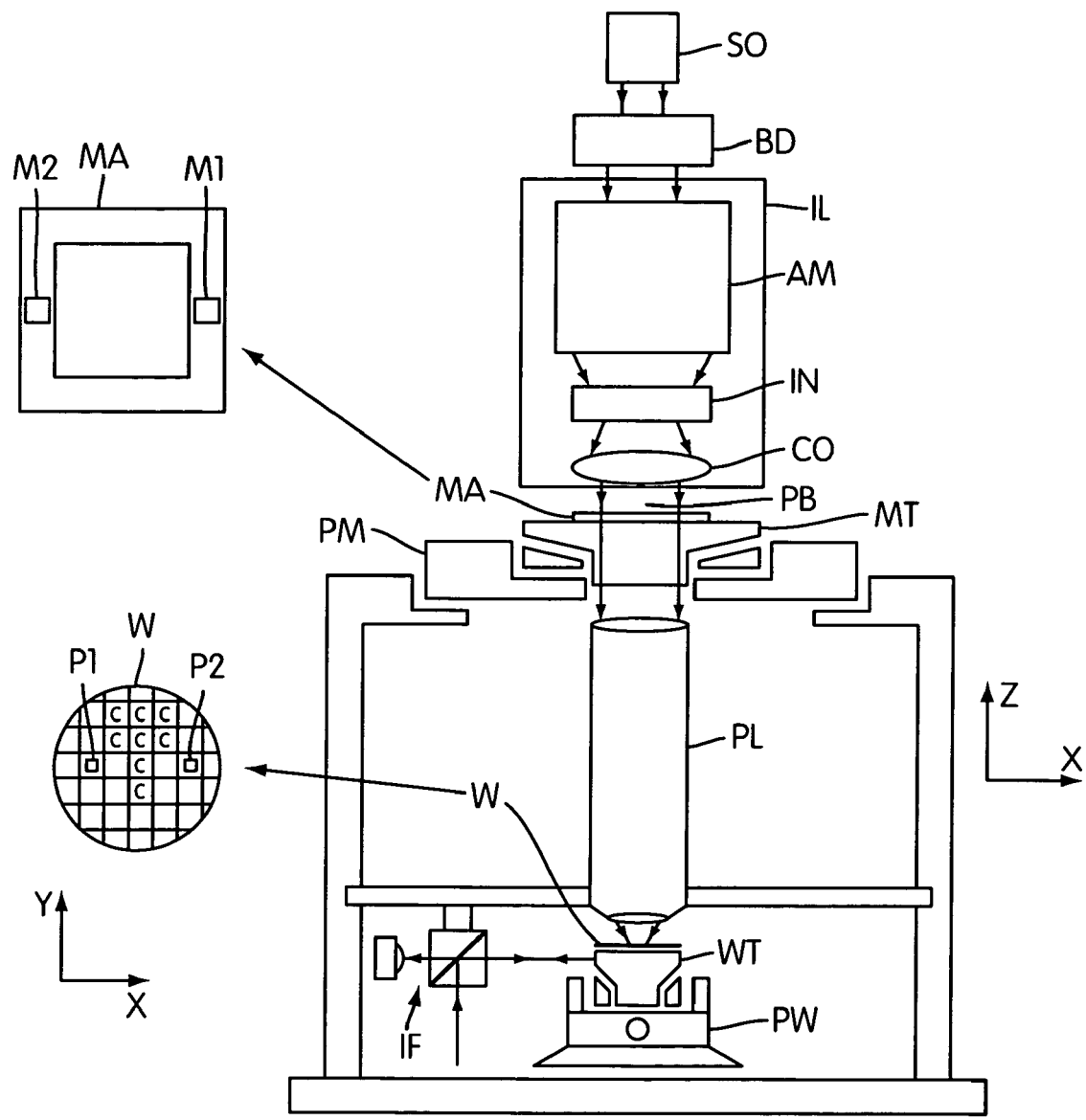
FIG. 1 schematically depicts a lithographic projection apparatus according to an embodiment of the invention.

FIG. 1 schematically depicts a lithographic apparatus according to a particular embodiment of the invention. The apparatus includes:

an illumination system (illuminator) IL adapted to condition a beam PB of radiation (e.g., UV radiation such as for example generated by an excimer laser operating at a wavelength of 193 nm or 157 nm, or EUV radiation generated by a laser-fired plasma source operating at 13.6 nm);

a support structure (e.g., a mask table) MT configured to hold a patterning device (e.g., a mask) MA and connected to first positioning device PM configured to accurately position the patterning device with respect to item PL;

a substrate table (e.g., a wafer table) WT configured to hold a substrate (e.g., a resist-coated wafer) W and connected to second positioning device PW configured to accurately position the substrate with respect to item PL; and a projection system (e.g., a refractive projection lens) PL adapted to image a pattern imparted to the beam PB by the patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the projection system PL, which focuses the beam onto a target portion C of the substrate W. In current apparatus, employing patterning by a mask on a mask table, in general, the projection system will have a magnification factor M (generally<1). For example, the imaging of the mask pattern onto the target portion of the substrate by a conventional lithographic projection system is arranged at a magnification M=−0.25. In the present text and figures the magnification M is assumed to be 1, for the purpose of simplicity. The invention is not limited to the use of unit magnification projection systems.

With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the support structure MT and the substrate table WT will be realized with the aid of a long-stroke module (coarse positioning) and a short-stroke module (fine positioning), which form part of the one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. The depicted apparatus can be used in the following preferred modes:

1. In step mode, the support structure MT and the substrate table WT are kept essentially stationary, while an entire pattern imparted to the projection beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e., a single dynamic exposure). The velocity and direction of the substrate table WT relative to the support structure MT is determined by the magnification or demagnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A need exists to achieve finer optical resolutions and circumvent the theoretical half-pitch lower limit $k_1$ of 0.25 as this would allow printing smaller and more densely spaced features without resorting to expensive technologies that employ shorter wavelengths and/or higher numerical apertures.

Figure 2:
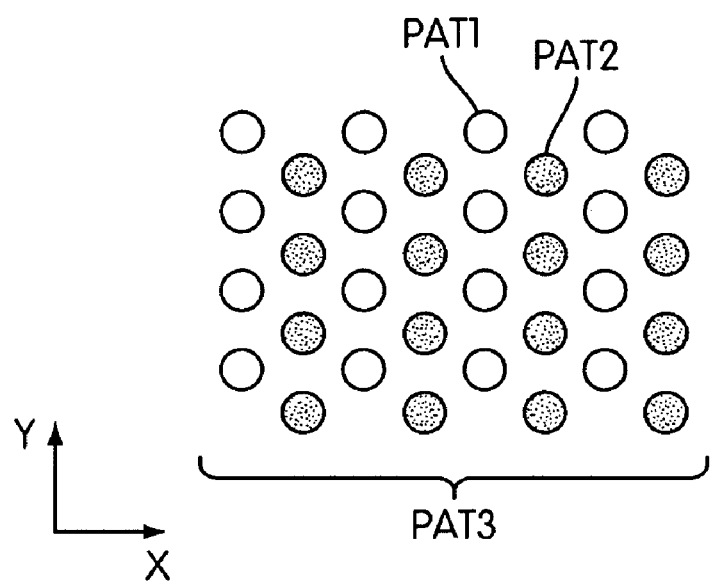
FIG. 2 depicts a typical example of a multiple exposure approach, using two exposures, for printing contact holes, according to an embodiment of the present invention.

One approach to lowering $k_1$ is by using a double exposure to expose a substrate to two complementary images (for example, of two complementary mask patterns) that individually are less difficult to print but when imaged on the same substrate they produce a combined image that would have been more difficult to print otherwise. FIG. 2 illustrates a typical example of this approach in which a pattern PAT1 with a larger pitch (compared to the minimum pitch in pattern PAT3), shown in FIG. 2 as features represented by blank filled circles, is exposed (first exposure) and projected onto a substrate (not shown). The substrate is shifted and a second pattern PAT2, shown in FIG. 2 as features represented as gray filled circles, is exposed (second exposure) and projected onto the same substrate so that the features of the second pattern PAT2 fit between the features of the first pattern PAT1. The two patterns PAT1 and PAT2 are thus combined, interleaved, or otherwise superimposed, to obtain a desired pattern PAT3 which is more densely spaced than patterns PAT1 and PAT2 taken separately. The second pattern PAT2 can be a same pattern as the first pattern PAT1 or a different pattern. In other words, the period between the features of the first pattern PAT1 and the period between the features of the second pattern PAT2, in X and/or Y directions, can be the same or different. In addition, features of the first pattern and features of the second pattern can be the same (for example, contact holes with a same diameter) or different features (for example, contact holes with different diameters).

Figure 3:
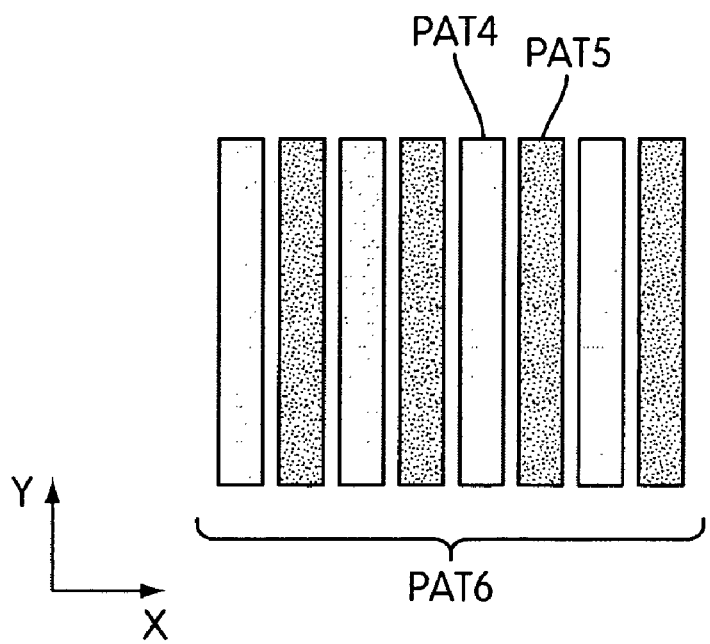
FIG. 3 depicts a typical example of a multiple exposure approach, using two exposures, for printing lines, according to an embodiment of the present invention.

In another example, the features of the first pattern and/or second pattern instead of being contact holes, the features of the first pattern and the second pattern can be lines or posts. FIG. 3 illustrates a first pattern (pattern PAT4) with a larger pitch, shown in FIG. 3 as lines represented by blank filled rectangles, which is exposed (first exposure) and projected onto a substrate (not shown). The substrate is shifted and a second pattern (pattern PAT5), shown in FIG. 3 as lines represented as gray filled rectangles, is exposed (second exposure) and projected onto the same substrate so that the features of the second pattern PAT5 fit between the features of the first pattern PAT4. Similarly to the example illustrated in FIG. 2, the two patterns PAT4 and PAT5 are combined, interleaved, or otherwise superimposed, to obtain a pattern PAT6 which is more densely spaced than patterns PAT4 and PAT5 taken separately. In this example, the first pattern PAT4 and the second pattern PAT5 have similar features, i.e., lines having equal widths, but shifted relative to each other. However, it must be appreciated that the second pattern PAT5 can be a same pattern as the first pattern PAT4 or a different pattern. In other words, the period between the lines of the first pattern PAT4 and the period between the lines of the second pattern PAT5, in X and/or Y directions (depending on the orientation of the lines), can be the same or different. In addition, the lines of the first pattern and lines of the second pattern can be the same (for example, lines with a same width) or different lines (for example, lines with different widths).

This double exposure technique can be used to print patterns that are much more densely spaced (compared to the spacing of features of constituent patterns such as PAT1 and PAT2) allowing imaging below a $k_1$ value of 0.25. However, printing with a double exposure on a same resist (on a same substrate) may be difficult as cross-talk between the two images of patterns PAT1 and PAT2 and between the two images of patterns PAT4 and PAT5 may occur which may lead to deterioration of resolution. To prevent cross-talk between the images of the first pattern (PAT1, PAT4) and the second pattern (PAT2, PAT5) the images are transferred to or held within the substrate.

However, transferring the images to the same substrate requires extremely aggressive overlay specifications and additional process steps. The most common implementation of this double exposure technique requires etching and cleaning the substrate (or etching a sacrificial layer on the substrate) between the first and second exposures. The etch and clean steps are additional steps that may introduce a delay of 24 hours to 48 hours between the first and second exposures. The additional steps may also introduce additional difficulties in the lithographic process. The relatively long period between the two exposures may impact the overlay performance of the lithographic apparatus and may affect the imaging stability of the lithographic apparatus and the coat/develop track that is typically linked to the lithographic apparatus which together are commonly referred to as a lithographic cluster.

Furthermore, the additional process steps may be required to be performed outside the lithographic cluster, i.e., outside the lithographic apparatus and/or outside the coat/develop track, which may involve additional labor and thus add cost to the overall process. In addition, the additional process steps may also increase tracking requirements to insure that the second exposure is performed on the same lithographic apparatus so as to maintain the tightest possible overlay and imaging performance. All these and other limitations may reduce to a certain extent the performance of the lithographic process.

To eliminate the need for the additional process steps (e.g., etch and clean steps) currently used to implement reduced pitch double exposure, a developable material layer is applied on a surface of the substrate prior to applying the resist layer onto the substrate. In one or more embodiments of the invention, the developable material is a developable Bottom Anti-Reflective Coating (BARC) or a wet developable material or a combination of developable BARC and a wet developable material layer. A suitable developable BARC material may be, for example, IMBARC™, a coating manufactured by Brewer Science, Inc, or D-BARC™, a coating manufactured by AZ Electronic Materials Corporation. By using the developable material layer, e.g., D-BARC™, the substrate can be kept within the lithography cluster, i.e., inside the lithographic apparatus and/or the coat/develop track, during the full cycle of the double exposure (first and second exposure). As a result, any time delay that may occur between the first and second exposures can be significantly reduced. In addition, the use of this developable material layer can be extended beyond two exposures to include many exposures.

Figure 4:
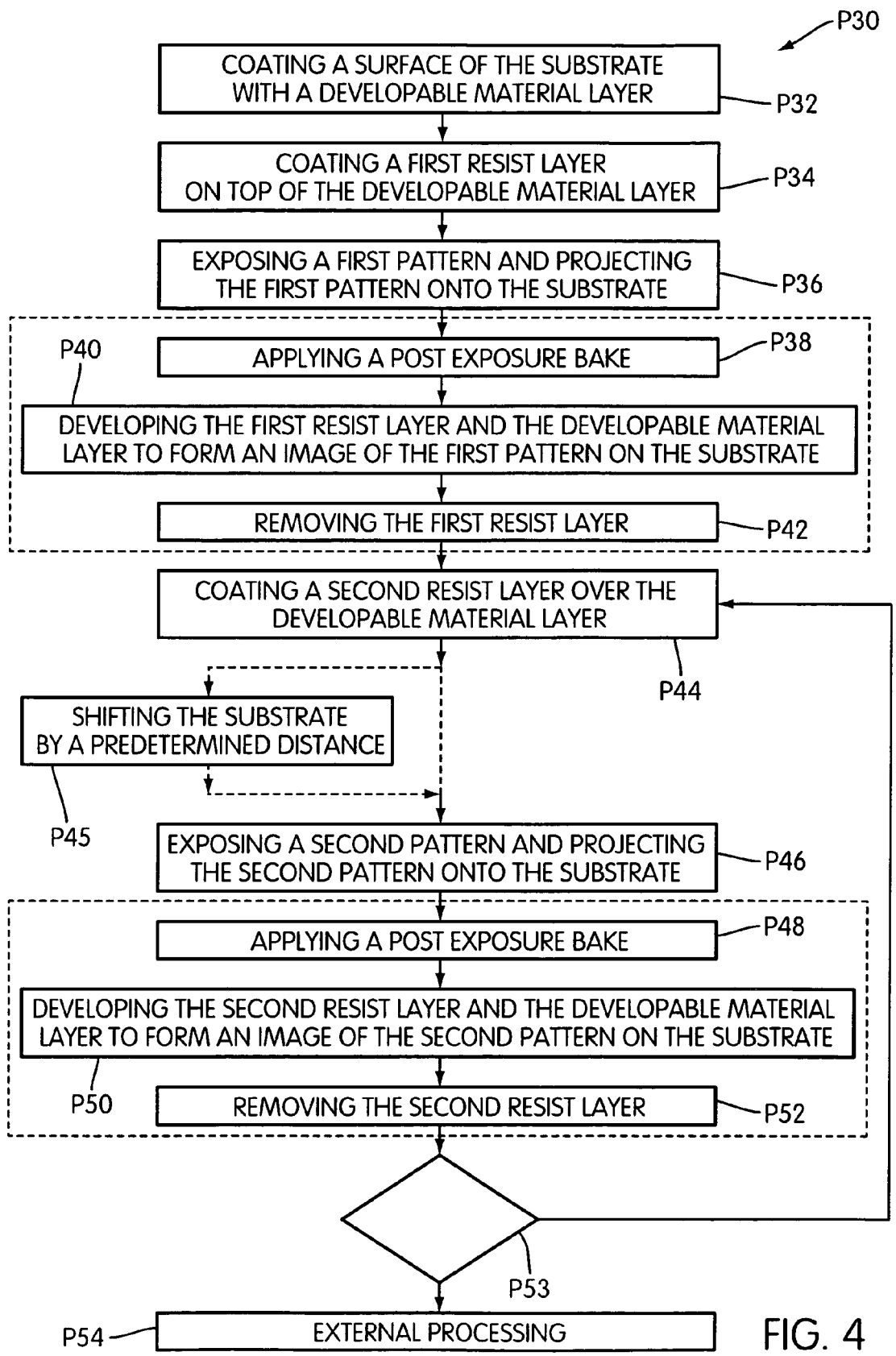
FIG. 4 shows a flow diagram of a lithographic process according to an embodiment of the present invention.

FIG. 4 shows a flow diagram of a lithographic process according to an embodiment of the present invention. The lithographic process (P30) includes, coating a surface of a substrate with a developable material layer (P32) and coating a first resist layer on top of the developable material layer (P34). The lithographic process (P30) further includes exposing a first pattern and projecting the first pattern onto the substrate coated with the developable material layer and the first resist layer (P36), so that the first resist layer is exposed to an image of the first pattern. Next, applying a post exposure bake (P38) and developing the first resist layer and developable material layer result in the formation of a first target pattern in accordance with an image of the first pattern on the substrate (in the first resist layer and the developable material layer) (P40).

The first resist layer comprises a material that is sensitive to radiation at a wavelength of exposure radiation. When the first pattern is exposed and projected onto the substrate coated with the developable material layer and the first resist layer, areas of the first resist layer exposed to radiation undergo chemical and/or physical changes. As a result, in a case of a positive resist, areas of the first resist layer exposed to radiation become more soluble to chemical solvents, i.e. developers, while areas not exposed to radiation remain insoluble. Developing the first resist layer includes removing the soluble portion of the first resist layer to form holes or voids in the first resist layer. In a case of a negative resist, areas of the first resist layer exposed to radiation become more resistant to chemical solvents/solutions while areas not exposed to radiation remain soluble. In this case, developing the first resist layer includes removing the soluble portion of the first resist layer to form islands or posts corresponding to areas of the first resist layer exposed to radiation.

The developable material layer may or may not comprise a material that is sensitive to radiation. If the developable material layer comprises a material that is sensitive to radiation, the developable material layer behaves as a resist layer in a sense that exposed areas of the developable material layer undergo chemical and/or physical changes. In this case, the developable material layer can be developed in the same way as the first resist layer. If the developable material layer does not comprise a material that is sensitive to radiation, i.e. does not have any radiation-reactive properties, the developable material layer does not react to radiation and hence does not have any properties related to the "tone" of either a positive tone resist or a negative tone resist. As a result, areas of the developable material layer lying directly underneath areas of the first resist layer that have been exposed to radiation (in a case of a positive resist) or lying directly underneath areas of the first resist layer that have not been exposed to radiation (in a case of a negative resist) simply develop away, once the areas of the first resist layer are removed, by using an appropriate chemical solvent/solution (for example, an aqueous solution). In other words, if the developable material layer does not have any radiation-reactive properties, processing of the developable material layer will be governed by the development state of the first resist layer. In either case, i.e. positive resist or negative resist, the first pattern projected onto the first resist layer is carried to the developable material layer.

The lithographic process (P30) proceeds by removing the first resist layer, for example with wet processing, while the processed developable material carrying the first target pattern is maintained on the substrate (P42). The removal of the first resist layer is followed by coating a second resist layer over the processed developable material layer (P44). In an embodiment of the invention, removing the first resist layer (P42) and coating the second resist layer (P44) are carried out in a same area within the coat/develop track (e.g., a coating bowl).

The lithographic process (P30) further includes exposing a second pattern and projecting the second pattern onto the substrate coated with the developable material layer and the second resist layer (P46), such as to expose the second resist layer to an image of the second pattern. The process (P30) further includes applying a post exposure bake (P48) and developing the second resist layer and the developable material layer to form a second target pattern, in accordance with an image of the second pattern, on the substrate (in the second resist layer and the developable material layer) (P50).

Similarly to the first resist layer, the second resist layer may also have positive resist properties or negative resist properties. In either case, the second pattern projected onto the second resist layer is carried to the developable material layer.

The lithographic process proceeds by removing the second resist layer, for example with wet processing, while the processed developable material layer carrying the first and second target patterns is maintained (P52). At point (P53), the substrate can be, for example, coated with a third resist layer and the processes (P44 and following processes) repeated via a loop in the lithographic process (P30), or the substrate can be released for further post lithographic processing (P54). This process loop of applying a third resist layer and possibly a plurality of subsequent resist layers can be repeated as desired to achieve a desired image quality and/or resolution. As previously stated, the second pattern can be the same pattern as the first pattern or different from the first pattern. In the case that the second pattern is merely a shifted version of the first, or otherwise requires an offset, prior to projecting the second pattern, the substrate is shifted or offset by a predetermined distance D in the X and/or Y directions (P45). The predetermined distance D corresponds to the shift required to adequately image the features of the second pattern on the second resist layer and developable material layer in order to superimpose or interleave the second pattern features in between the features of the already imaged and printed first (target) pattern on the developable material layer so as to render the desired pattern, i.e., the combination of the first and second target patterns.

In the present embodiment as well as in any of the other embodiments, either one of the or both of the development steps P40 and P50 may comprise two separate developer steps, one for the resist and one for the developable material.

The following paragraphs describe the state of the substrate after the process steps described above are carried out. FIGS. 5A-5G depict a status of a processed substrate after performing the steps of the lithographic process described above.

Figure 5A:
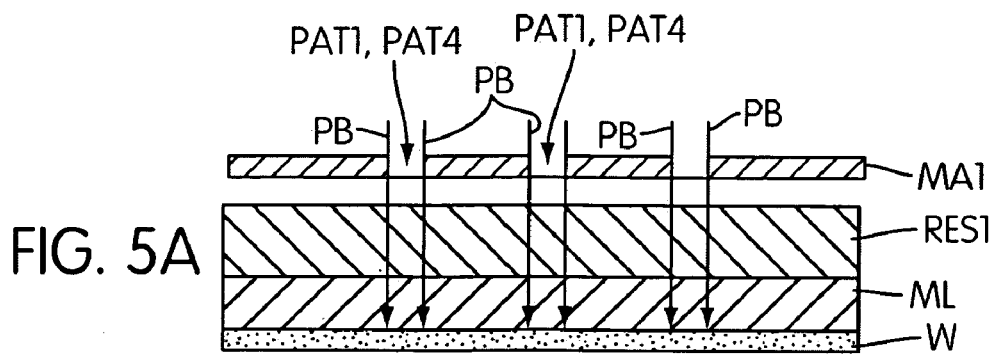
FIGS. 5A-5G depict the state of the substrate after performing various steps of the process shown in FIG. 4.

FIG. 5A shows a substrate W having a surface coated with a developable material layer ML. A first resist layer RES1 is coated over the developable material layer ML. The substrate W with developable material layer ML and resist layer RES1 is exposed to a patterned radiation generated by projecting radiation PB through a mask MA1 having a first pattern, for example PAT1 or PAT4 shown in FIGS. 2 and 3. The patterned radiation as illustrated schematically in FIG. 5A corresponds to an image of the mask pattern at unit magnification M=1, so that the first and second target patterns may schematically be represented by (PAT1, PAT4) and (PAT2, PAT5) as well, hereinafter. However, as mentioned above, the present invention is not limited to generation or projection of images at unit magnification. For simplicity the presence of a projection system operating at a magnification different from 1 is not shown in FIG. 5A.

Figure 5B:
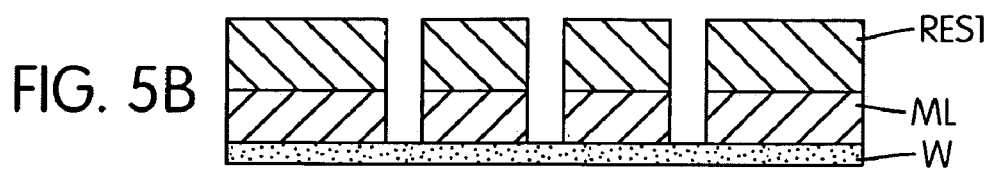

FIG. 5B shows the substrate W with the developable material layer ML and resist layer RES1 both carrying the first target pattern (PAT1, PAT4). The developable material layer ML and first resist layer RES1 are developed. The exposed areas of the first resist layer RES1 are removed in the case of a positive resist process. In the case of a negative resist process, unexposed areas in the resist layer RES1 are removed. As discussed above, the developable material layer ML can be sensitive to radiation or non-sensitive to radiation. In the case where the developable material layer ML is sensitive to radiation, the areas of the developable material layer ML exposed to radiation are removed in the same way as the exposed areas of the first resist layer RES1. In the case where the developable material layer is not sensitive to radiation, once the exposed areas of the first resist layer RES1 are removed, the areas of the developable material layer ML lying underneath the exposed areas of the first resist layer RES1 will follow suit because the developable material layer ML is dissolvable in a chemical solvent (for example an aqueous solution).

As a result, features corresponding to the first pattern (PAT1, PAT4) are formed in both the first resist layer RES1 and the developable material layer ML. The features may be voids (as shown in FIG. 5B) in the case of a positive resist process or peaks or islands in the case of a negative resist process (not shown). In both cases, this results in the first pattern (PAT1, PAT4) being transferred into the resist layer RES1 and the developable material layer ML.

Figure 5C:
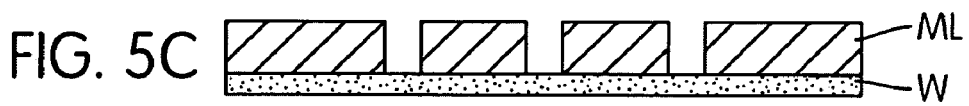

FIG. 5C shows the substrate after removal or stripping of the first resist layer RES1 but with the developable material layer ML carrying the first target pattern (PAT1, PAT4). The first resist layer RES1 is removed while the developable material layer ML carrying the first target pattern (PAT1, PAT4) is maintained on the substrate W.

Figure 5D:
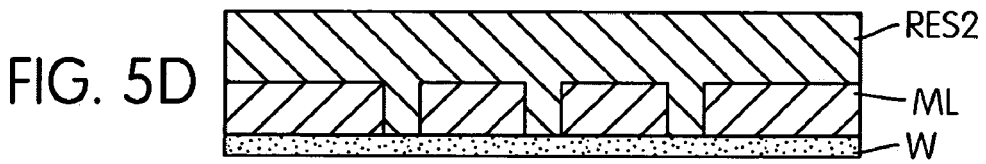

FIG. 5D shows the substrate coated with a second resist layer RES2. The second resist layer is coated over the developable material layer ML carrying the first target pattern (PAT1, PAT4). As a result, voids in the developable material layer ML corresponding to the first target pattern (PAT1, PAT4) are filled with the resist material. Although FIG. 5D shows a substrate on which a positive resist process is applied, it must be appreciated that the process discussed herein may be applied to a negative resist process. In a negative resist process, the second resist layer RES2 is coated over the developable material layer ML to fill the voids corresponding to complements of the peak or island features.

Figure 5E:
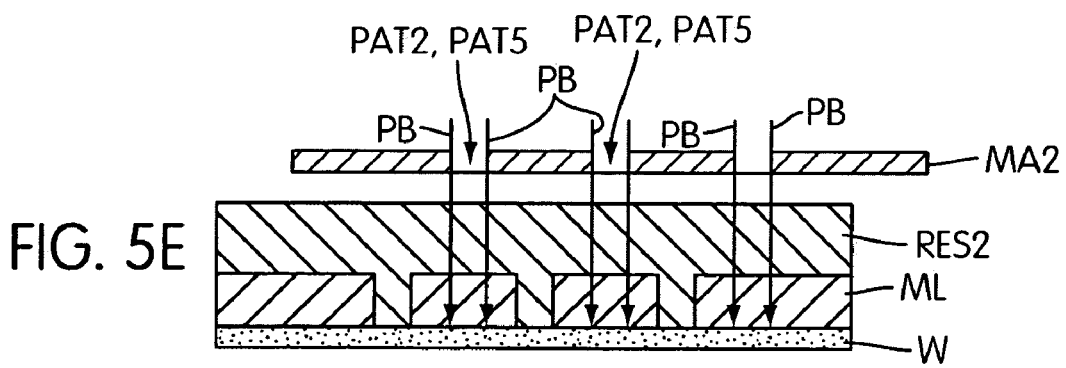

FIG. 5E shows the substrate W with a surface coated with the developable material layer ML and the second resist layer RES2. The substrate W with developable material layer ML and exposed areas of resist layer RES2 is exposed to a patterned radiation generated by projecting radiation PB through a mask MA2 having a second pattern (PAT2, PAT5). The second pattern (PAT2, PAT5) can be the same as the first pattern (PAT1, PAT4) or different from the first pattern (PAT1, PAT4). In an embodiment of the invention, prior to projecting the second pattern (PAT2, PAT5), the substrate W is shifted or offset by a predetermined distance D in the X and/or Y directions. The predetermined distance D corresponds to the shift required to adequately image the features of the second pattern (PAT2, PAT5) on the resist layer RES2 in order to superimpose the second pattern (PAT2, PAT5) features in between the features of the already-imaged first pattern (PAT1, PAT4) so as to render the desired pattern in the developable material layer.

Figure 5F:
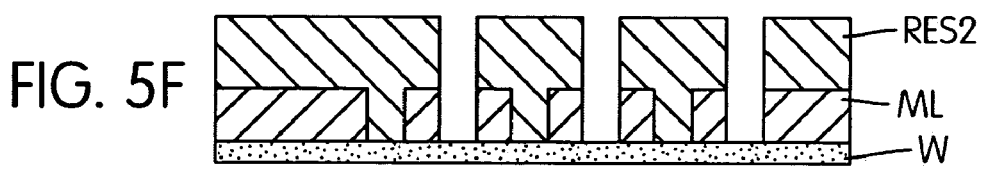

FIG. 5F shows the substrate W after the developable material layer ML and resist layer RES2 are developed by removing the exposed areas in the resist layer RES2, in the case of a positive resist process or by removing unexposed areas in the resist layer RES2 in the case of a negative resist process, to form the second target pattern (PAT2, PAT5). As discussed above, the developable material layer ML can be sensitive or not sensitive to radiation. In the case where the developable material layer ML is sensitive to radiation, the areas of the developable material layer ML exposed to radiation are removed in the same way as the exposed areas of the second resist layer RES2. In the case where the developable material layer is not sensitive to radiation, once the exposed areas of the second resist layer RES2 are removed, the areas of the developable material layer ML lying underneath the exposed areas of the second resist layer RES2 will follow suit because the developable material layer ML is dissolvable in a chemical solvent (for example an aqueous solution).

As a result, features corresponding to the second pattern (PAT2, PAT5) are formed in both the second resist layer RES2 and the developable material layer ML. The features may be voids (as shown in FIG. 5F) in the case of a positive resist process or peaks or islands in the case of a negative resist process (not shown). In this way, the second pattern (PAT2, PAT5) is transferred into the resist layer RES2 and the developable material layer ML.

Figure 5G:
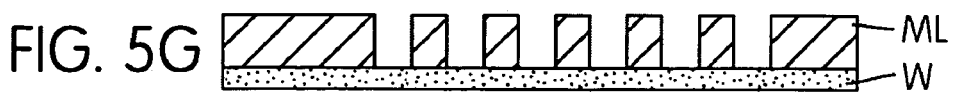

FIG. 5G shows the substrate after removal of the second resist layer RES2. The second resist layer RES2 is removed while the developable material layer ML carrying both the first and the second target patterns is maintained on the substrate W. The obtained substrate W with the developable material layer ML carries the desired pattern which is a combination of the first pattern (PAT1, PAT4) and second pattern (PAT2, PAT5). The obtained substrate is thus prepared for further processing which may include, additional repetitions of the lithographic process described herein or for example, etching, ion-implantation (doping), metallization, oxidation, chemical, mechanical polishing, etc.

In an embodiment of the invention, a thickness of the developable material layer ML is between 400 Å (40 nm) and 1200 Å (120 nm). In embodiment of the invention, the thickness of the developable material layer is selected to be equal to 800 Å (80 nm). By applying a layer of developable material having a thickness between 40 nm and 120 nm, for example equal to 80 nm, a near isotropic development of a feature (for example, a contact hole, a line, a post, a trench or a combination thereof) in the developable material layer ML can be achieved.

Figure 6:
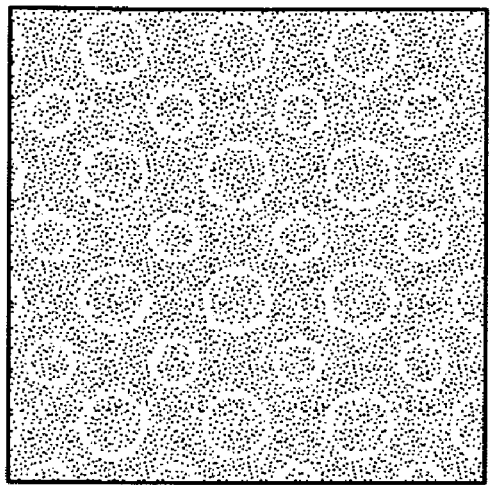
FIG. 6 shows a scanning electron microscope photograph of a plurality of contact holes formed in a developable material using the process shown in FIG. 4.

FIG. 6 shows a Scanning Electron Microscope (SEM) photograph of a plurality of contact holes imaged in a developable material using the process described herein. In this example, the second pattern is different from the first pattern. Specifically, the diameter of the contact holes of the first pattern is smaller than the diameter of the holes of the second pattern. This is done merely for easily distinguishing between the contact holes imaged with the first pattern and contact holes imaged with the second pattern. It should be appreciated that any combination of patterns can be imaged using the process described herein. This example demonstrates that the process discussed herein can be used to print patterns that are much more densely spaced than would have been possible by only using one pattern, thus allowing imaging below a k1 value of 0.25.

According to an embodiment of the present invention, the method of the embodiment described above is modified for enabling printing of lines or line shaped features at a pitch corresponding to a k1 value below 0.25 wherein positive tone resist may be used for each constituent patterning process. Each of the two exposures of the present embodiment involves the imaging of dark lines on a bright background. Such imaging yields highest resolution for a given radiation wavelength and numerical aperture, for line shaped features.

Figure 11:
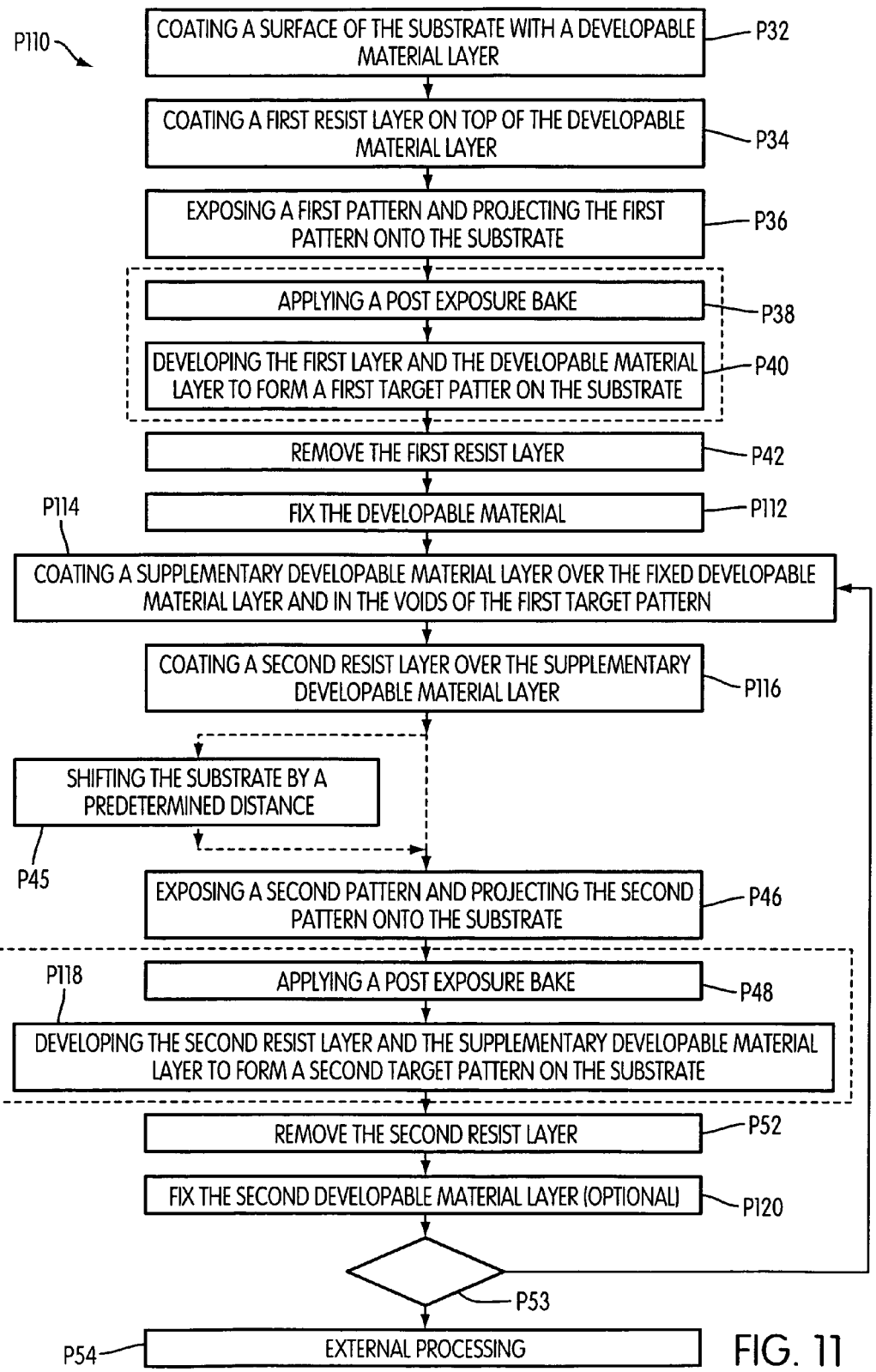
FIG. 11 shows a flow diagram of a lithographic process according to a further embodiment of the present invention.

In FIG. 11 the corresponding modified process flow P110 is illustrated. Steps of the present method which are the same as in the previous embodiment and which are described above, carry the reference of the corresponding steps in FIG. 4. FIG. 12 illustrates the state of the substrate W after some of the steps of the process flow P110.

To provide a substrate W with a desired pattern PAT6 of line shaped features, a surface of the substrate W is first coated with a developable material layer ML such as a layer of IMBARC™. Next a first positive tone resist layer RES1 is coated on top of the developable material layer ML. Then, the first resist layer RES1 is exposed to radiation of a beam PB patterned as an image of a first pattern PAT4 on a mask MA1, see FIG. 12A. The method proceeds with developing the first resist layer RES1 and the developable material layer ML to provide the developable material layer ML with a first target pattern PAT4, as illustrated in FIG. 12B. Next the first resist layer RES1 is removed, see FIG. 12C, and the developable material layer ML provided with the first target pattern is fixed, see step P112 in FIG. 11.

The effect of fixing can be obtained by applying, for example, a chemical fixing. Alternatively, the effect of fixing can be provided by applying one of or a combination of wet chemical fixing, thermal fixing, gas phase chemical fixing, fixing by UV irradiation, fixing by electron beam irradiation, and fixing by ion beam irradiation. As a result, the substrate W carries a pattern of features of fixed developable material FML, as illustrated in FIG. 12D.

Next, a supplementary developable material layer SML is applied to (or coated on top of) the developable material layer with the first target pattern PAT4 to fill the voids of the first target pattern PAT4, see FIG. 12E and step P114 in FIG. 11.

The supplementary developable material layer SML can be sensitive or not sensitive to radiation. In the case where the supplementary developable material layer SML is sensitive to radiation, the areas of the supplementary developable material layer SML exposed to radiation are removed in the same way as the exposed areas of the second resist layer RES2 (applied over the developable material layer—see below). In the case where the supplementary developable material layer is not sensitive to radiation, once the exposed areas of the second resist layer RES2 are removed, the areas of the supplementary developable material layer SML lying underneath the exposed areas of the second resist layer RES2 will follow suit because the supplementary developable material layer SML is dissolvable in a chemical solvent (for example an aqueous solution).

When executing step P114, the features of the first target pattern PAT4 may be overcoated with the supplementary developable material SML as well. This possibility is not shown in FIG. 12E. Such a residual overcoating of features will have no substantial effect on the end result of the process, since any such supplementary developable material SML will be developed away later in the process.

The method proceeds with coating a second positive tone resist layer RES2 on top of the supplementary developable material layer SML (and optionally the fixed developable material FML), see FIG. 12E and step P116 in FIG. 11, and exposing the second resist layer RES2 to an image of a second pattern PAT5, see FIG. 12F.

After developing the second resist layer RES2 and the supplementary developable material layer SML, see step P118 in FIG. 11, the supplementary developable material layer SML is provided with a second target pattern PAT5, whereby the line shaped features of the second target pattern PAT5 comprise stacks of a layer of supplementary developable material SML and a layer of second resist RES2, see FIG. 12G. This develop process does not remove the fixed developable material layer FML due to the prior processing of this layer.

Upon removal of the second resist RES2 the features of the desired pattern PAT6 are obtained as line shaped features of fixed developable material FML in accordance with the pattern PAT4 and of supplementary developable material SML in accordance with the pattern PAT5, see FIG. 12H. The SML and FML material features in combination produce the desired pattern on the substrate. By arranging the two exposures in interlaced position, as in the previous embodiment, the desired pattern PAT6 is produced and provided on the surface of the substrate.

FIG. 12I shows the substrate W containing the fixed developable material FML and the supplementary developable material FSML after the supplementary developable material SML has been fixed, see step P120 in FIG. 11, converting it to fixed developable material FSML. The fixation of the supplementary developable material SML may not be required depending on processing requirements. The fixed developable material FML and FSML retain the first and second target pattern (PAT4 and PAT5) on the substrate W.

The obtained substrate W with the fixed developable material layer FML and the fixed supplementary developable material layer FSML carries the desired pattern PAT6 which is a combination of the first target pattern PAT4 and second pattern PAT5. The obtained substrate is thus prepared for further processing which may include, additional repetitions of the lithographic process described herein or for example, one or a combination of etching, ion-implantation (doping), metallization, oxidation, chemical, and mechanical polishing.

The present embodiment can be characterized by a repetition of at least two sequences, each including similar steps. Any individual sequence of steps is directed at providing a target pattern of features, such as for example PAT4 or PAT5, on a surface of a substrate W and includes coating the surface of the substrate W with a developable material layer, such as for example the layer ML or SML, coating a resist layer on top of the developable material layer, such as for example RES1 or RES2, exposing the resist layer to an image of the target pattern, developing the resist layer and the developable material layer to provide the developable material layer with the target pattern, wherein a desired pattern of features, such as for example PAT6, on the surface of the substrate W includes first and second target patterns of features (such as for example the patterns PAT4 and PAT5) on the surface of the substrate.

Figure 7:
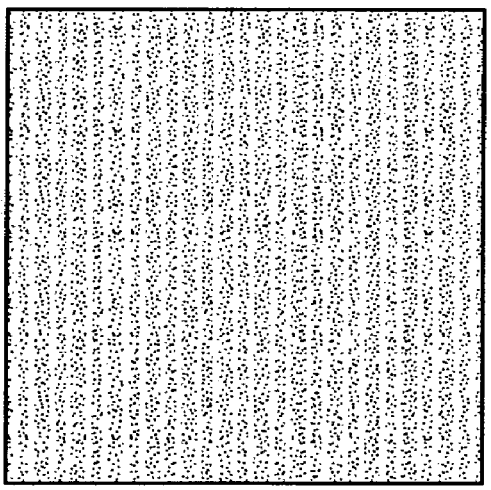
FIG. 7 shows a scanning electron microscope photograph of a plurality of lines formed in a developable material using the process shown in FIG. 4.

FIG. 7 shows a Scanning Electron Microscope (SEM) photograph of a plurality of dense lines imaged in a developable material using the process described herein. In this example, the dense lines are imaged with a half-pitch of 70 nm, a numerical aperture NA equal to 0.8 and using a radiation at a wavelength of 248 nm. This example demonstrates that the process or processes discussed herein can be used to print patterns that are much more densely spaced than would have been possible by only using one pattern, thus, allowing imaging at a k1 value of 0.23, i.e., a k1 value lower than 0.25. Furthermore, this example, shows that the process or processes described herein can be used to image and print various patterns including, but not limited to, contact holes, lines, posts, and trenches.

Besides the advantageous features of the other embodiments, the present embodiment of the method is advantageous for generating line space patterns and in particular dense low $k_1$ line space patterns because dark lines on a bright background can be used for exposure. With positive tone resist therefore lines are printed (instead of spaces) with each of the two exposures. Because lines are printed with each of the two exposures, the CD of the printed line width is not directly coupled to the mutual alignment of the two exposures, thereby relaxing alignment requirements.

The present embodiment is not limited to the use of positive tone resists, neither is it limited to the printing of line patterns. It must be appreciated that the process discussed herein may be applied to a negative resist process for either the first exposure or the second exposure.

Figure 8:
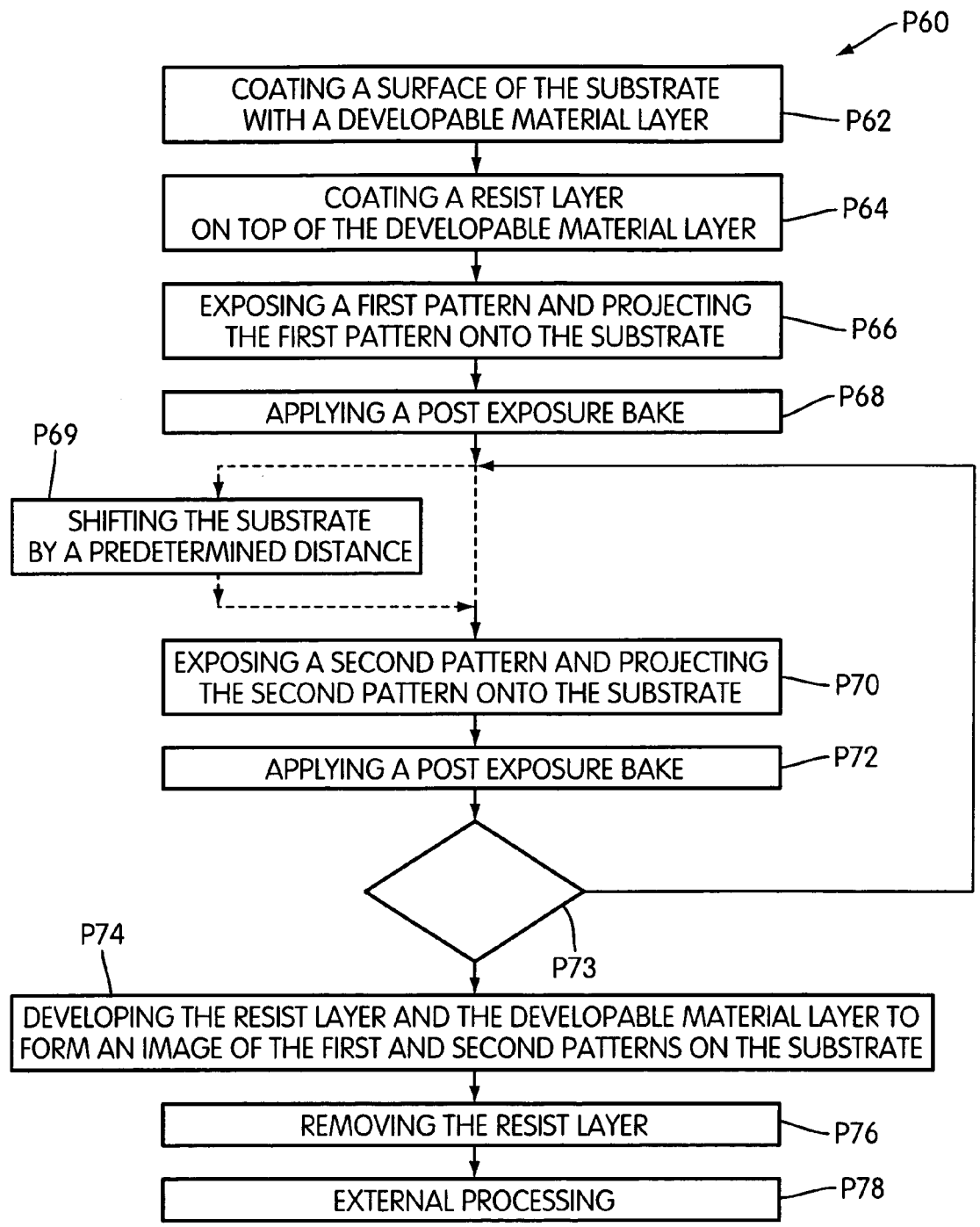
FIG. 8 shows a flow diagram of a lithographic process according to another embodiment of the present invention.

FIG. 8 shows a flow diagram of a lithographic process according to another embodiment of the present invention. The lithographic process (P60) includes, coating a surface of a substrate with a developable material layer (P62) and coating a resist layer on top of the developable material layer (P64). The lithographic process (P60) further includes exposing a first pattern and projecting the first pattern onto the substrate coated with the developable material layer and the resist layer (P66) and applying a post exposure bake (P68).

The lithographic process (P30) further includes exposing a second pattern and projecting the second pattern onto the substrate coated with the developable material layer and the resist layer (P70) and applying a post exposure bake (P72).

At point (P73), the substrate can be, for example, exposed to a third pattern if desired and a post exposure bake applied to the substrate by repeating the processes (P70 and P72) via a loop in the lithographic process (P60). This process loop of exposing a third pattern and possibly a plurality of patterns can be repeated as desired to achieve a desired image quality and/or resolution. The second pattern can be the same pattern as the first pattern or different from the first pattern. Similarly, the third pattern can be the same as the second and/or first pattern or different from the first and/or the second pattern. For example, in the case that the second pattern is merely a shifted version of the first pattern, or otherwise requires an offset, prior to projecting the second pattern, the substrate is shifted or offset by a predetermined distance D in the X and/or Y directions (P69). The predetermined distance D corresponds to the shift required to adequately image the features of the second pattern on the second resist layer and developable material layer in order to superimpose or interleave the second pattern features in between the features of the already imaged first pattern on the developable material layer so as to render the desired target pattern. This shifting of the substrate can also be applied when projecting the third pattern so as to superpose or interleave third pattern features in between the features of the first and second pattern.

When the exposure of the first pattern, second pattern and possibly the third pattern and following post exposure bake is finished, the lithographic process (P60) progresses by developing the resist layer and the developable material layer to form the first and the second target patterns (and a third target pattern and possibly other target patterns as desired) on the substrate (in the resist layer and the developable material layer) (P74). The lithographic process (P60) then proceeds by removing the resist layer, for example with wet processing, while the processed developable material layer carrying the first and second (and possibly third) target patterns is maintained (P76). At this point of the lithographic process, the substrate carrying the developable material can be sent for further processing (P78).

Figure 9:
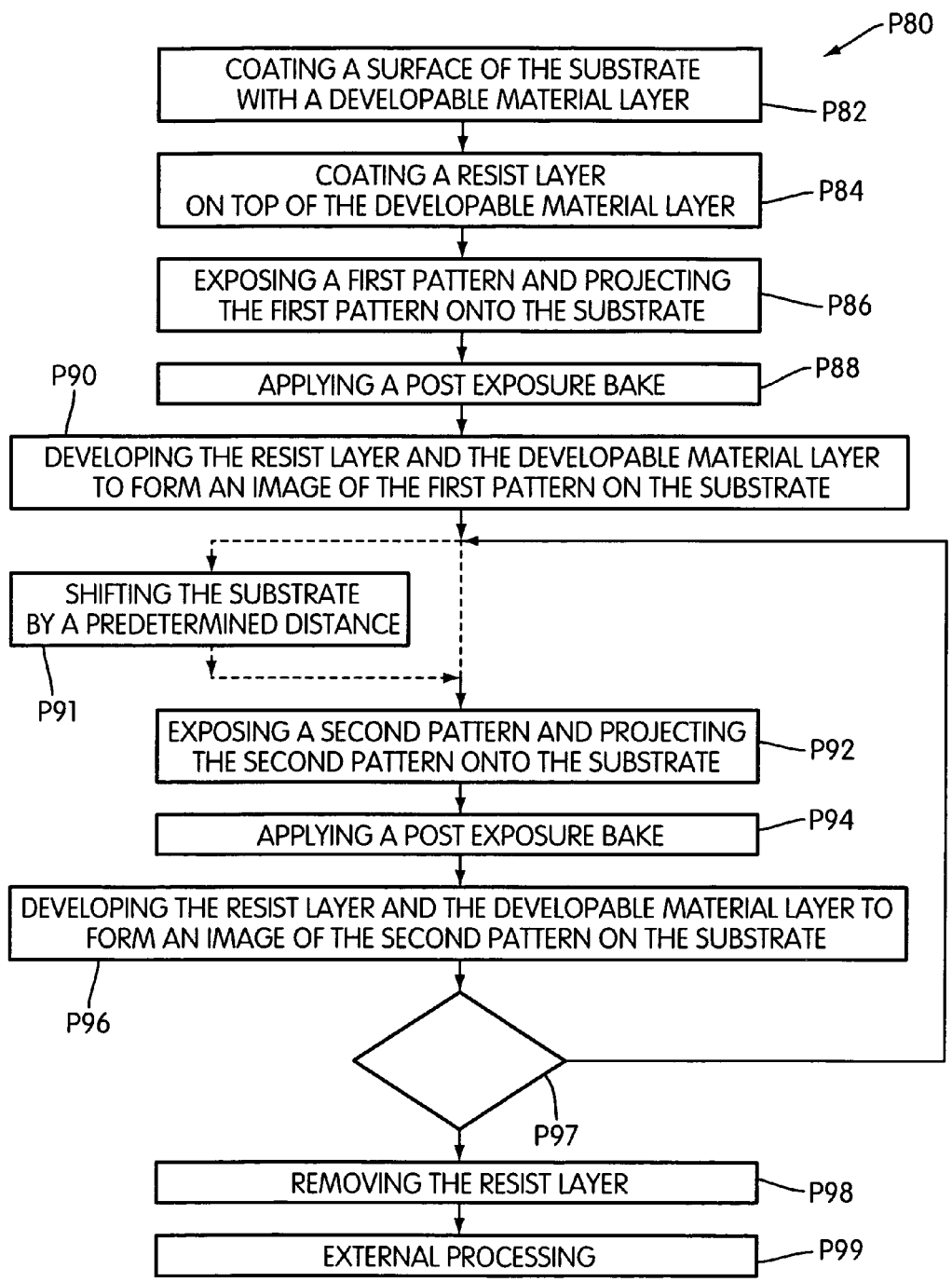
FIG. 9 shows a flow diagram of a lithographic process according to alternative embodiment of the present invention.

FIG. 9 shows a flow diagram of a lithographic process according to an alternative embodiment of the present invention. The lithographic process (P80) includes, coating a surface of a substrate with a developable material layer (P82) and coating a resist layer on top of the developable material layer (P84). The lithographic process (P60) further includes exposing a first pattern and projecting the first pattern onto the substrate coated with the developable material layer and the resist layer (P86), applying a post exposure bake (P88) and developing the resist layer and the developable material layer to form a first target pattern on the substrate, in the resist layer and the developable material layer (P90).

The lithographic process (P80) further includes exposing a second pattern and projecting the second pattern onto the substrate coated with the developable material layer and the resist layer (P92), applying a post exposure bake (P94) and developing the resist layer and the developable material layer to form a second target pattern on the substrate, in the resist layer and the developable material layer (P96).

At point (P97), the substrate can be, for example, exposed to a third pattern if desired and a post exposure bake applied to the substrate followed with developing the resist layer and the developable material layer by repeating the processes (P92, P94 and P96) via a loop in the lithographic process (P80). This process loop of exposing a third pattern can be repeated as desired to achieve a desired image quality and/or resolution. The second pattern can be the same pattern as the first pattern or different from the first pattern. Similarly, the third pattern can be the same as the second and/or first pattern or different from the first and/or the second pattern. For example, in the case that the second pattern is merely a shifted version of the first pattern, or otherwise requires an offset, prior to projecting the second pattern, the substrate is shifted or offset by a predetermined distance D in the X and/or Y directions (P91). The predetermined distance D corresponds to the shift required to adequately image the features of the second pattern on the second resist layer and developable material layer in order to superimpose or interleave the second pattern features in between the features of the already imaged first pattern so as to render the desired target pattern. This shifting of the substrate can also be applied when projecting the third pattern so as to superpose or interleave third pattern features in between the features of the first and second pattern. The lithographic process (P80) then proceeds by removing the resist layer, for example with wet processing, while the processed developable material layer carrying the first and second (and possibly third) target patterns is maintained (P98). At this point of the lithographic process, the substrate carrying the developable material can be sent for further processing (P99).

Figure 10:
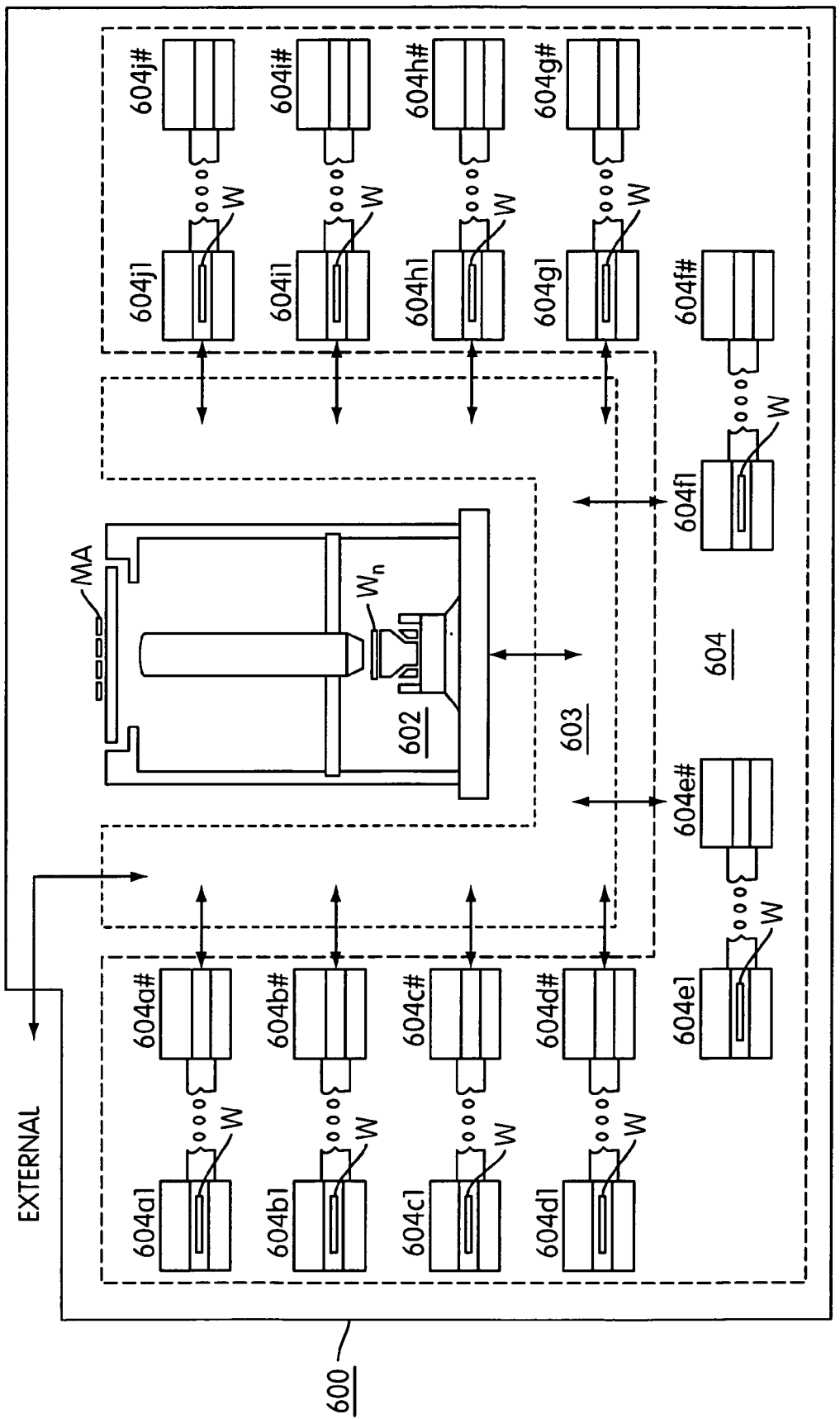
FIG. 10 shows a schematic diagram of a lithographic system according to an embodiment of the present invention.

FIG. 10 schematically depicts an integrated lithographic fabrication cluster system constructed and operative in accordance with a particular embodiment of the present invention. As illustrated, lithographic cluster 600 includes lithographic exposure apparatus 602, substrate handling apparatus 603, and coat/develop track apparatus 604.

Lithographic exposure apparatus 602 is configured to project a first pattern of a first patterning device onto the substrate and to project additional patterns of an additional patterning devices onto the substrate. An example of lithographic projection apparatus 602 is depicted in FIG. 1 and is described in detail in the previous paragraphs.

Coat/develop track apparatus 604 is configured to perform pre-exposure processes including, but not limited to, priming, anti-reflective coating, wet developable material coating, resist coating, soft bake processes, and measurement processes. Coat/develop track apparatus 604 is also configured to perform post exposure processes including, but not limited to, post exposure bake (PEB), development, resist removal, and measurement processes. In performing these pre- and post-exposure processes, a number of processing stations or modules $604_{a1}$-$604_{j1}$ are incorporated within the track apparatus 604. These processing modules $604_{a1}$-$604_{j1}$ may include chill plates, bake plates, coater modules, developer modules, priming modules, resist removal modules (resist stripping modules), and metrology modules. Multiple modules of any given type $604_{a1}$-$604_{a\#}$ (where # stands for the total number of the module of the given type) may be included within track apparatus 604 to increase throughput. In an embodiment of the invention the coat/develop track apparatus 604 is configured to deposit the wet developable material and resist material to the substrate prior to exposure as many times as required. The coat/develop track apparatus 604 is also configured to perform post exposure substrate processing including, post exposure bake, develop, hard bake, and resist removal processes as many times as required.

Substrate handling apparatus 603 is configured to transport the substrates W, in a pre-specified order, between processing modules $604_{a1}$-$604_{j1}$ of coat/develop apparatus 604 and exposure apparatus 602. Substrate handling apparatus 603 may include robotic, conveyor, or track mechanisms or combinations thereof to support the delivery and/or retrieval of substrates from processing modules $604_{a1}$-$604_{j1}$. Because coat/develop apparatus 604 includes a number of processing modules $604_{a1}$-$604_{j\#}$, all of these modules require the support of substrate handling apparatus 603 to load and unload the substrates W from the individual modules.

In an embodiment of the invention, for example, the substrate is coated with the developable material, baked, chilled, coated with the resist material, baked, and chilled within the coat/develop apparatus 604 and then transferred to the lithographic exposure apparatus 602. The substrate including the first process layer is exposed within the lithographic exposure apparatus 602 and transferred to the coat/develop apparatus 604 for post exposure processing. The coat/develop apparatus 604 applies a post exposure bake, develops the first resist layer, and removes the first resist layer. During this process all substrate handling and transportation is performed by the substrate handling apparatus 603. After processing the substrate in this way, the substrate may then be maintained within the coat/develop apparatus 604 and returned to the coating station, for example, to apply a second resist layer on top of the material layer (for example a developable material layer). The process of exposure in lithographic apparatus 602 is repeated and the substrate is returned to the coat/develop apparatus 604 for post exposure processing including post exposure bake, develop, and resist removal, before sending the substrate for further processing within the lithographic cluster or for further external process as indicated schematically by the arrow to external.

A modified embodiment of the present invention is the same as the previous embodiment except for the function of the coat/develop apparatus 604. In the present embodiment the coat/develop apparatus 604 not only applies a post exposure bake, develops the first resist layer, and removes the first resist layer after the first exposure, but also fixes the developable material. Further, in the present embodiment and after processing the substrate in this way, the substrate may then be maintained within the coat/develop apparatus 604 and returned to the coating station which is arranged to first apply a supplementary developable material layer and next apply a second resist layer on top of the supplementary developable material layer (and optionally the fixed developable material layer). As in the previous embodiment, the process of exposure in lithographic apparatus 602 is then repeated and the substrate is returned to the coat/develop apparatus 604 for post exposure processing.

Since numerous modifications and changes will readily occur to those of skill in the art, it is not desired to limit the invention to the exact construction and operation described herein. For example, while developable material is discussed herein as a suitable material to apply on the substrate before applying a first resist layer or a second resist layer, it should be appreciated that other materials and/or configurations, for example using a negative resist process, are also contemplated.

Moreover, the process, method and apparatus of the present invention, like related apparatus and processes used in the lithographic arts, tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A device manufacturing method for providing a desired pattern of features on a surface of a substrate comprising:
    exposing a first resist layer on top of a developable material layer on the substrate, to an image of a first pattern;
    developing the first resist layer and the developable material layer to provide the developable material layer with a first target pattern;
    removing the first resist layer;
    supplying a supplementary developable material layer to fill voids of the first target pattern of the developable material layer;
    coating a second resist layer on top of the supplementary developable material layer;
    exposing the second resist layer to an image of a second pattern; and
    developing the second resist layer and the supplemental developable material layer to provide the supplemental developable material layer with a second target pattern, wherein material of or on the substrate immediately beneath the developable material layer is not etched between the coating the surface of the substrate with the developable material layer and the coating the second resist layer on top of the supplemental developable material layer, and the first and second target patterns produce the desired pattern on the surface of the substrate.

2. The method of claim 1, wherein the desired pattern comprises patterned features with a half-pitch corresponding to a k1 less than or equal to 0.25.

3. The method of claim 1, wherein the developable material layer comprises a wet developable material, a developable bottom anti-reflective material, or both.

4. The method of claim 1, further comprising exposing a first patterning device with a beam of radiation to form the first pattern.

5. The method of claim 4, further comprising exposing a second patterning device with a beam of radiation to form the second pattern.

6. The method of claim 1, further comprising:
coating a third resist layer on top of the supplemental developable material layer; and
projecting a third target pattern onto an area of the substrate coated with the supplemental developable material layer and the third resist layer,
wherein the first, second and third target patterns produce the desired pattern on the surface of the substrate.

7. The method of claim 1, further comprising:
prior to exposing the second resist layer, shifting the substrate by a certain distance so as to interleave an image of the second pattern with the first target pattern.

8. The method of claim 1, wherein the first pattern and the second pattern are substantially the same.

9. The method of claim 1, wherein a period between features of the first pattern and a period between features of the second pattern is substantially the same.

10. A device manufacturing method for providing a desired pattern of features on a surface of a substrate comprising:
coating the surface of the substrate with a developable material layer;
coating a first resist layer on top of the developable material layer;
exposing the first resist layer to an image of a first pattern;
developing the first resist layer and the developable material layer to provide the developable material layer with a first target pattern;
removing the first resist layer;
fixing the developable material layer provided with the first target pattern;
supplying a supplementary developable material layer to fill voids of the first target pattern of the developable material layer;
coating a second resist layer on top of the supplementary developable material layer;
exposing the second resist layer to an image of a second pattern; and
developing the second resist layer and the supplementary developable material layer to provide the supplementary developable material layer with a second target pattern, wherein a layer beneath the developable material layer is not etched between the coating the surface of the substrate with the developable material layer and the coating the second resist layer on top of the supplementary developable material layer, and the first and second target patterns produce the desired pattern on the surface of the substrate.

11. The method of claim 10, wherein the developable material layer comprises a wet developable material, a developable bottom anti-reflective material, or both.

12. The method of claim 10, wherein the supplementary developable material layer comprises a wet developable material, a developable bottom anti-reflective material, or both.

13. The method of claim 10, further comprising exposing a first patterning device with a beam of radiation to form the first pattern.

14. The method of claim 10, wherein removing the first resist layer, fixing the developable material layer, supplying the supplementary developable layer and coating the second resist layer are performed in a same area of a lithographic cluster.

15. The method of claim 14, wherein the lithographic cluster comprises a lithographic apparatus and a coat/develop track system.

16. The method of claim 10, further comprising exposing a second patterning device with a beam of radiation to form the second pattern.

17. The method of claim 10, further comprising:
prior to exposing the second resist layer, shifting the substrate in a lithographic cluster by a certain distance so as to interleave the image of the second pattern with the first target pattern.

18. The method of claim 10, wherein the first pattern and the second pattern are substantially the same.

19. The method of claim 10, wherein a period between features of the first pattern and a period between features of the second pattern is substantially the same.

20. The method of claim 10, wherein features of the first pattern and features of the second pattern are substantially different.

21. The method of claim 10, wherein the first pattern comprises features configured to print contact holes, trenches, lines, posts or a combination thereof.

22. The method of claim 10, wherein the second pattern comprises features configured to print contact holes, trenches, lines, posts or a combination thereof.

23. The method of claim 10, wherein a thickness of the developable material layer is selected to achieve a near isotropic development of a feature in the developable material layer.

24. The method of claim 10, wherein a thickness of the supplementary developable material layer is selected to achieve a near isotropic development of a feature in the supplementary developable material layer.

25. A device manufacturing method for providing a desired pattern of features on a surface of a substrate comprising:
coating a resist layer on top of a developable material layer on the substrate and a supplementary target pattern of features of developable material on the substrate;
exposing the resist layer to an image of a target pattern; and
developing the resist layer and the developable material layer to provide the developable material layer with a target pattern of features, wherein the desired pattern of features on the surface of the substrate includes the target pattern of features and the supplementary target pattern of features.

26. The method of claim 25, wherein the desired pattern comprises patterned features with a half-pitch corresponding to a k1 less than or equal to 0.25.

27. The method of claim 25, wherein the developable material layer comprises a wet developable material, a developable bottom anti-reflective material, or both.

28. The method of claim 25, further comprising exposing a patterning device with a beam of radiation to form the image of the target pattern.

29. The method of claim 25, further comprising:
prior to exposing the resist layer, shifting the substrate by a certain distance so as to interleave an image of the target pattern with the supplementary target pattern.

30. The method of claim 25, wherein the target pattern of features and the supplementary target pattern of features are substantially the same.

31. The method of claim 25, wherein a period between features of the target pattern of features and a period between features of the supplementary target pattern of features is substantially the same.

32. The method of claim 25, wherein the supplementary target pattern of features is of fixed developable material.

33. The method of claim 25, further comprising coating the developable material to, and/or on top of, the supplementary target pattern of features of developable material on the substrate.

* * * * *